United States Patent [19]

Nakanishi et al.

[11] 4,404,545
[45] Sep. 13, 1983

[54] ANALOG-TO-DIGITAL CONVERTER OF THE DUAL SLOPE TYPE

[75] Inventors: Tousaku Nakanishi, Nara; Hiroshi Tsuda, Uji, both of Japan

[73] Assignee: Sharp Kabushiki Kaisha, Osaka, Japan

[21] Appl. No.: 258,313

[22] Filed: Apr. 28, 1981

Related U.S. Application Data

[63] Continuation of Ser. No. 11,913, Feb. 13, 1979, abandoned.

[51] Int. Cl.³ .............................................. H03K 13/02
[52] U.S. Cl. ...................... 340/347 NT; 340/347 AD; 340/347 CC; 340/347 M; 324/99 D
[58] Field of Search .... 340/347 M, 347 CC, 347 AD, 340/347 NT; 324/99 D

[56] References Cited

U.S. PATENT DOCUMENTS

| | | | |
|---|---|---|---|
| 3,836,905 | 9/1974 | Cross | 340/347 M |
| 3,872,466 | 3/1975 | Wold | 340/347 NT |
| 3,942,173 | 3/1976 | Wold | 340/347 NT |
| 4,122,719 | 10/1978 | Carlson et al. | 73/342 |

OTHER PUBLICATIONS

Schmid, Electronic Analog/Digital Conversions, Van Nostrand Reinhold Co., 1970, pp. 282–283.

*Primary Examiner*—T. J. Sloyan
*Attorney, Agent, or Firm*—Birch, Stewart, Kolasch & Birch

[57] ABSTRACT

Errors in determining a measured voltage are mathematically canceled in an analog-to-digital converter circuit useful for dual slope type using positive and negative values of a reference voltage. The errors are due to the off-set voltages inherent to operational amplifiers employed for an integrator and a comparator included within the analog-to-digital converter circuit. A counter circuit is provided for storing time information related to first and second dual slopes. A mathematical calculation is conducted with the aid of all the time information of the first and second dual slopes, whereby the measured voltage can be determined with eliminating the influence by the off-set voltage.

4 Claims, 8 Drawing Figures

ANALOG-TO-DIGITAL CONVERTER OF THE DUAL SLOPE TYPE

This application is a continuation of copending application Ser. No. 11,913, filed on Feb. 13, 1979, abandoned.

BACKGROUND OF THE INVENTION

The present invention relates to analog-to-digital conversion circuitry and, more particularly, to an analog-to-digital converter useful for dual slope (double integral) operation where an off-set voltage inherent to an operational amplifier for an integrator can be canceled by mathematical calculation.

In the conventional analog-to-digital converter circuit, the off-set voltage caused errors in determining a measured voltage. Several further problems arise in connection with the analog-to-digital conversion system, especially when combined with computer system.

OBJECTS AND SUMMARY OF THE INVENTION

Accordingly, it is the primary object of the invention to provide an improved analog-to-digital conversion circuit of the dual slope type useful in computer systems.

It is a further object of the invention to provide an improved analog-to-digital conversion circuit where measurement errors caused by the off-set voltage inherent to an integrator therein are cancelled by mathematical calculation.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, at least three analog switches are connected to an integrator of an operational amplifier for supplying a measured voltage and positive and negative values of a reference voltage. A comparator of the operation amplifier is connected to the integrator for performing two series of dual integral slope calculations. The first dual integral slope calculation is carried out during time periods related to the positive and negative reference voltages. The second dual integral slope calculation is concerned with the time periods related to the measured voltage and either of the positive and negative reference voltages.

A counter circuit is provided for counting the respective time periods. Mathematical calculations are conducted to determine the measured voltage using all the time periods, whereby errors in identifying the value of the measured voltage can be mathematically canceled, the errors being derived from the off-set voltages inherent to the integrator and the comparator.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE INVENTION

Figure 1:
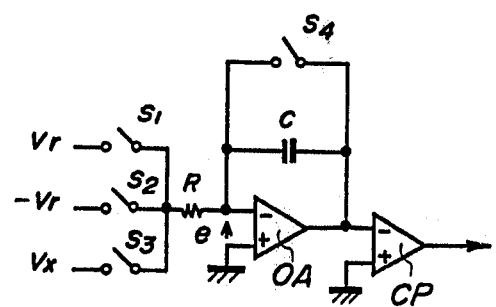
FIG. 1 is a block diagram of an analog-to-digital converter circuit made in accordance with the principles of the present invention.

FIG. 1 is an analog-to-digital converter circuit made in accordance with the principles of the present invention, where double integral calculation (Dual Slope Operation) is carried out.

In FIG. 1, there are provided an integrator (operational amplifier) OA, a comparator (Operational amplifier) CP, three switches S1, S2, S3 and S4, a capacitor C and a resistor R. Each of positive and negative values of a reference voltage is identified as Vr and $-Vr$ ($Vr > 0$). A measured voltage is denoted as Vx ($Vx < 0$). The off-set voltage of the integrator OA is denoted as e.

Figure 2:
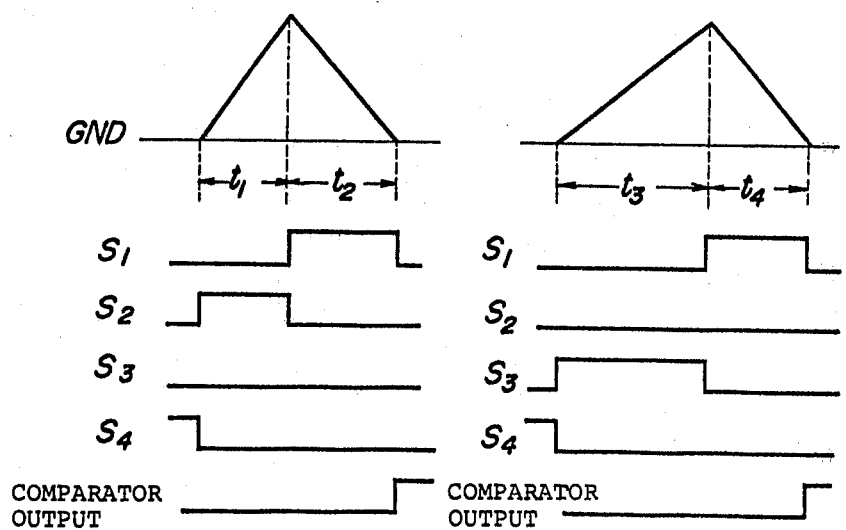
FIGS. 2(A) and 2(B) are time charts of various signals occurring within the analog-to-digital converter circuit shown in FIG. 1.

FIGS. 2(A) and 2(B) are time charts of various signals occurring within the analog-to-digital converter circuit shown in FIG. 1. In FIGS. 2(A) and 2(B), the respective time periods are denoted as $t_1$ to $t_4$.

With reference to FIGS. 1, 2(A) and 2(B), the principles of the present invention will be described below in detail.

Assuming that the switch S4 is closed to discharge charge contained within the capacitor C, the switch S2 is then closed during the time period $t_1$. The application of the negative reference voltage $-Vr$ into the integrator OA allows it to generate a rising output voltage as illustrated in FIG. 2(A). The switch S1 is closed in lieu of the switch S2 after the elapse of the time $t_1$. The positive reference voltage Vr is applied into the integrator OA. The output voltage of the integrator OA at this time goes down for the time period $t_2$ before it reaches the ground level. The following equation is determined by the above circumstances.

$$\frac{1}{CR}(Vr + e)t_1 = \frac{1}{CR}(Vr - e)t_2 \quad (1)$$

Therefore, the following formula is derived in accordance with the equation (1).

$$(Vr + e)t_1 = (Vr - e)t_2 \quad (2)$$

With reference to FIG. 2(B), similarly, the following equation can be derived with the aid of the switches S1 and S3 to apply the positive reference voltage Vr and the measuring voltage Vx, respectively.

$$(Vx + e)t_3 = (Vr - e)t_4 \quad (3)$$

According to the equations (2) and (3), the measuring voltage Vx can be represented by the following equation with mathematically canceling the term of the off-set voltage e.

$$V_x = \frac{2t_4 t_1 - t_3(t_2 - t_1)}{t_3(t_1 + t_2)} V_r \quad (4)$$

This means that the measured voltage Vx can be identified according to the equation (4), storing the data of the time periods $t_1$ to $t_4$ in a storage location, say, a counter.

Figure 3:
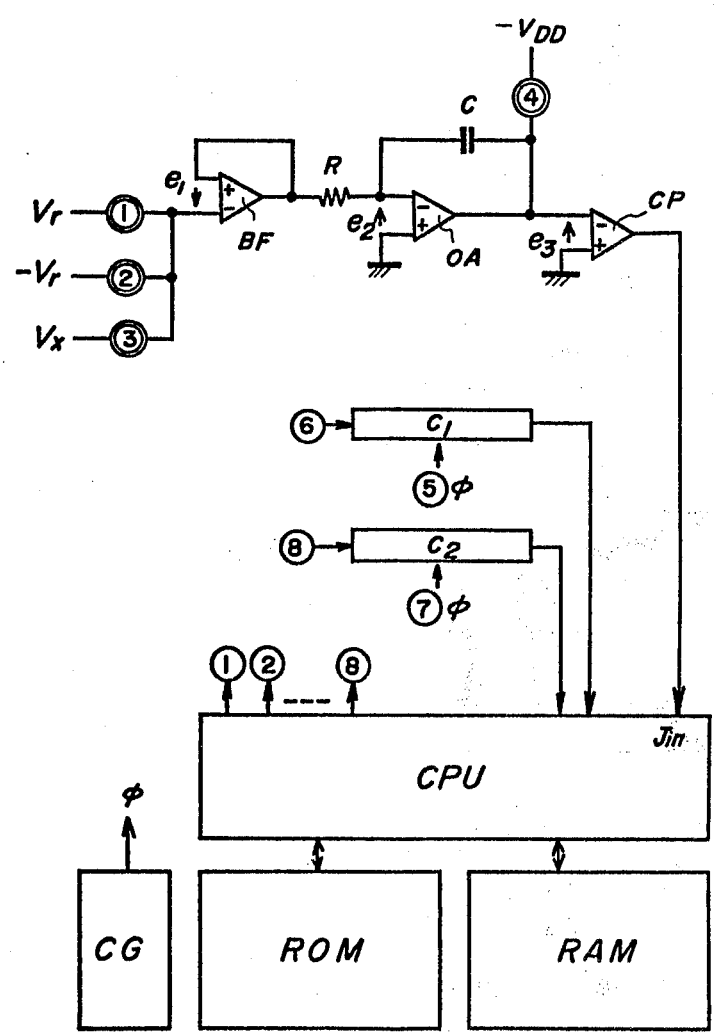
FIG. 3 is a block diagram of another analog-to-digital circuit according to the present invention.

FIG. 3 is a more specific analog-to-digital converter circuit according to the present invention. Like elements corresponding to those of FIG. 1 are indicated by like numerals.

In FIG. 3, four analog switches ① to ④ correspond to the switches S1 to S4, respectively. An input buffer BF is provided for assuring an input voltage applied to the integrator OA independent on variations in the characteristics of the analog switches ① to ③ owing to the magnitude of the input voltage. This is because the input impedance of the input buffer BF can be considered as infinity in practice. Since MOS transistors can be used as the analog switches ① to ④, the impedance in the conductive condition of the analog switches is inevitably varied depending on the magnitude of the input voltage. When a specific analog switch has a current therein, voltage drop is necessarily carried out to cause the variations in the value of the voltage applied to the integrator OA. With the aid of the input buffer BF, little current flows through the analog switches so that a specific value of a voltage applied in the input buffer BF is allowed to introduce into the integrator OA with reverse polarity.

Two counters C1 and C2 are provided for causing count-up operations using clock pulses $\phi$ developed from a clock pulse generator (CG). A central processing unit (CPU) is connected to the counters C1 and C2 for transferring the contents of the counters C1 and C2 into a random accees memory (RAM). The CPU generates a plurality of micro-order signals ① to ⑧. The respective analog switches ① to ④ are operated by the micro-order signals ① to ④. The micro-order signals ⑤ and ⑦ are used to control the supply of the clock pulses $\phi$ into the counters C1 and C2, respectively. Each of the micro-order signal ⑥ and ⑧ is employed to reset the counters C1 and C2.

The output of the comparator CP is introduced into the CPU to serve as judge signals. A read only memory (ROM) contains a program carring out the calculation as described later. The micro-order signals ① to ⑧ are developed according to the program. The counters C1 and C2 functions to determine the time periods $t_1$ to $t_4$ shown in FIGS. 2(A) and 2(B) and transfer the data into the RAM for storing purposes. The ROM further contains the program to carry out the equation (4) so as to determine the measured voltage using the data included within the RAM.

Each of the off-set voltages of the input buffer BF, the integrator OA and the comparator CP is identified as e1, e2 and e3. The analog switch ④ functions so that the output voltage of the integrator OA begins with $-V_{DD}$. The output voltage of the comparator CP reverses its way at the point where there is separated a value of the off-set voltage e3 from the ground level. If the reverse point is utilized for measuring the time period, no influence of the off-set voltage e3 can be produced.

Figure 4:
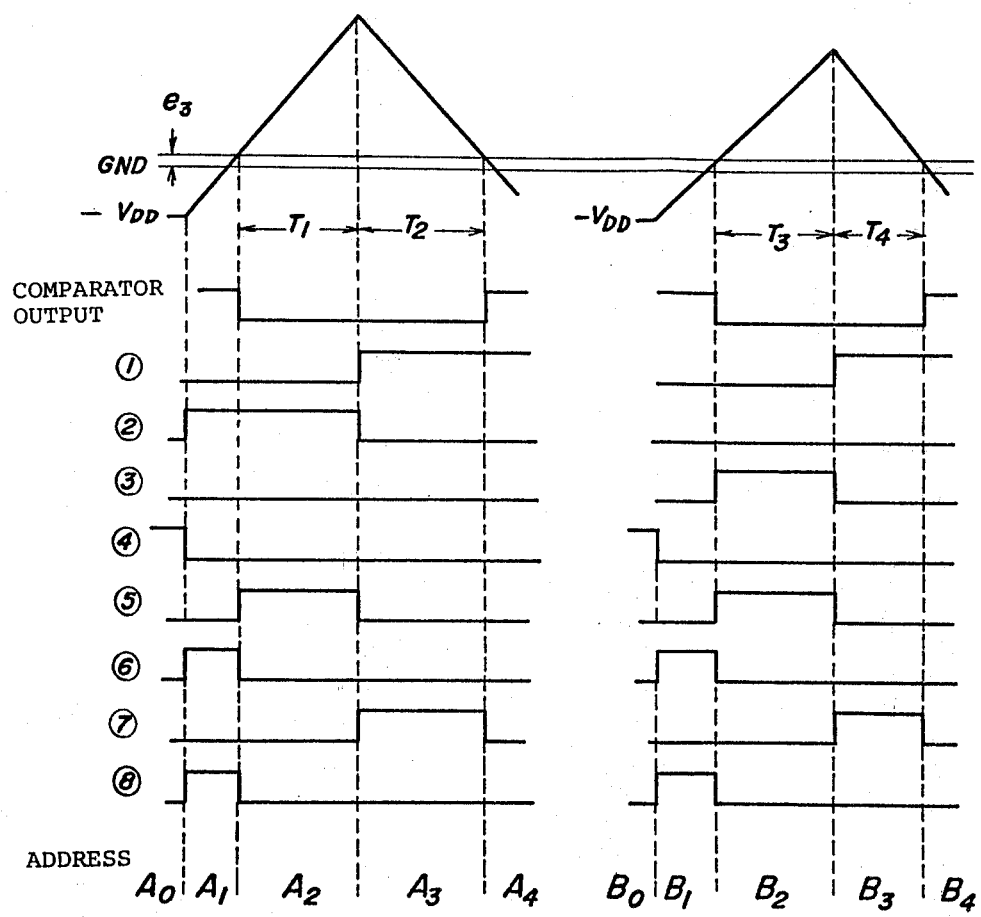
FIGS. 4(A), 4(B), 5(A) and 5(B) are time charts of various signals occurring within the analog-to-digital converter circuit shown in FIG. 3.

FIGS. 4(A) and 4(B) are the similar time charts as those of FIGS. 2(A) and 2(B), respectively, with the exception that FIGS. 4(A) and 4(B) are related to the analog-to-digital converter circuit shown in FIG. 3.

Referring to FIG. 4(A), the measurement operation starts under the condition that the address of the ROM is selected as A0. Upon the set of the address A0, the micro-order signal ④ is provided to actuate the analog switch ④. The capacitor C is allowed to be charged at a negative voltage. The output voltage of the integrator OA proceeds towards negative polarity from the value of the ground level plus the off-set voltage e3.

On the other hand, the CPU is determining the output voltage of the comparator CP. The high level "1" of the output voltage of the comparator CP means that the output voltage of the integrator OA is in a lower level than the value of the ground level plus the off-set voltage e3. In other words, the measurement operaation in the address A0 is effected until the output voltage of the comparator CP becomes the high level "1". When the high level "1" is accomplished, the program advances the address A0 to A1.

The micro-order signals ②, ⑥ and ⑧ are developed so that the counters C1 and C2 are reset, a low level "0", in response to the micro-order signals ⑥ and ⑧. The analog switch ② is allowed to become conductive upon the micro-order signal ②. The input buffer BF receives the negative reference voltage $-V_r$. An effective value of the input voltage applied to the integrator OA is $-V_r - e_1 - e_2$ under the consideration of the off-set voltage.

Under these circumstances, the output voltage of the integrator OA arises upward. When the output voltage of the integrator OA becomes the value of the ground level plus the off-set voltage e3, the output voltage of the comparator CP changes from the high level "1" to the low level "0".

The CPU advances the address from A1 to A2 in determining the change in the output voltage of the comparator CP. In the address A2, the micro-order signals ② and ⑤ are generated so that the integration calculation remains carried out while the counter C1 starts counting operation in response to the micro-order signal ⑤. The counting operation of the counter C1 is continued for the time period T1 although value of the time period T1 is freely selected.

The CPU further advances the address from A2 to A3 upon the determination that the counting values of the counter C1 reach a predetermined value. The output voltage of the integrator OA can be represented by the formula at this present.

$$-\frac{1}{CR}(-V_r - e_1 - e_2)T1 + e_3 \quad (5)$$

The micro-order signals ① and ⑦ are developed in the address A3. The analog switch ① is turned conductive in response to the micro-order signal ① so that the positive reference voltage Vr is applied to the input buffer BF. The effective value of the input voltage for the integrator OA is $V_r - e_1 - e_2$. The counter C2 begins its counting operation with the aid of the micro-order signal ⑦. The other counter C1 keeps the counting results related to the time period T1 after the elapse of the micro-order signal ⑤.

The address A3 is maintained until the output voltage of the comparator CP reverses. The output voltage of the integrator OA becomes lower than the voltage represented by the formula (5). The output voltage of the comparator CP changes its condition from the low level "0" to the high level "1" when the same of the integrator OA has reached the voltage of the ground level plus the off-set voltage $e_3$. The CPU advances the address from A3 to A4 in accordance with the determination or judge of the change.

In the address A4, there is not provided the micro-order signal ⑦, whereby the counter C2 maintains the counting results related to the time period T2. Since the voltage drop of the integrator OA is considered as $1/RC\,(Vr-e_1-e_2)T2$ during the address A3, the initial voltage value for the comparator CP at the beginning of the address A4 can be represented as follows on the basis of the ground level.

$$\frac{1}{RC}(Vr - e_1 - e_2)T2 + e_3 \qquad (6)$$

In the address A4, the contents of the counters C1 and C2 are transferred into the RAM through the CPU so that the data are stored in the RAM for the time periods T1 and T2.

The following equation is derived on the basis of the equivalence of the formulas (5) and (6).

$$(Vr + e_1 + e_2)T1 = (Vr - e_1 - e_2)T2 \qquad (7)$$

Similarly, with reference to FIG. 4(B), the following equation can be further determined.

$$(Vx + e_1 + e_2)T3 = (Vr - e_1 - e_2)T4 \qquad (8)$$

Each of the formulas (7) and (8) is equivalent to that identified as (2) and (3). The terms of the off-set voltage $e_1$ and $e_2$ can be mathematically canceled as the equation (4).

It will be apparent that the RAM stores the data related to the time periods T1 to T4 by conducting the operations illustrated in FIGS. 4(A) and 4(B). The arithmetical calculation represented by the equation (4) is then carried out using the data contained with the CPU, the ROM and the RAM to determine the measured voltage Vx.

In practice, it is not necessary to conduct the operation indicated in FIG. 4(A) in each measuring case among that of FIGS. 4(A) and 4(B). This is because the value of the off-set voltage e can not abruptly change. The term off-set voltage e, as used herein, contains drift voltages of operational amplifiers. The term drift means, as is well known, that the off-set voltage is varied in accordance to temperature changes and the passage of time.

The above description is concerned with a fundamental step for determining the measured value Vx. An improved control for the measured value Vx will be described with reference to FIGS. 5(A) and 5(B) using the equation (4). The values of the time periods T1 and T3 each illustrated in FIGS. 4(A) and 4(B) can be freely selected so that it is possible to select the values at t=T1=T3. The counting operation of the count C2 is carried out while the comparator CP proceeds its operation from the first inversion to the second. After the completion of the operations illustrated in FIGS. 5(A) and 5(B), the RAM stores the data corresponding to the time periods T1 and T2.

Figure 5:
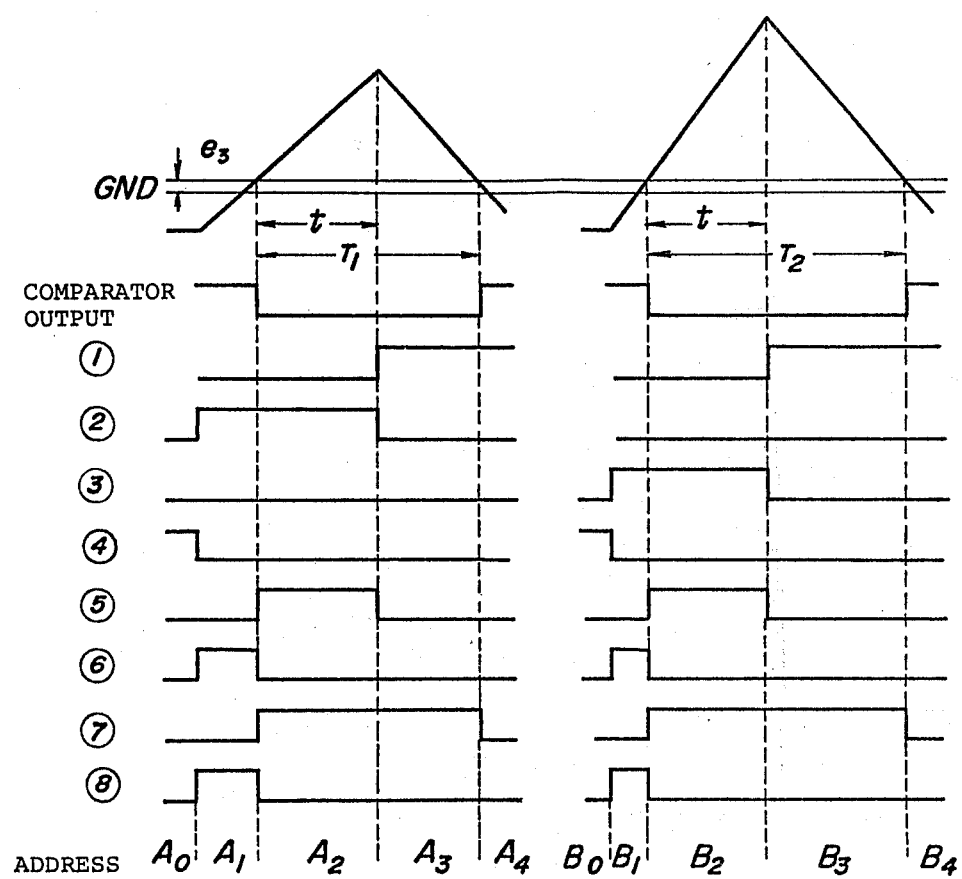

The following relationship is determined in the comparison with FIGS. 4(A), 4(B) and 5(A) and 5(B).
t=T1=T2
T1+T2 (both in FIGS. 4(A) and 4(B))=T1 (in FIGS. 5(A) and 5(B)).
T3+T4 (both in FIGS. 4(A) and 4(B)=T2 (in FIGS. 5(A) and 5(B))

The equation (4) can be changed to the following formula using the above-mentioned relationship.

$$Vx = \left(\frac{2T2 - T1}{T1}\right) Vr \qquad (9)$$

where the time periods T1 and T2 are related to FIGS. 5(A) and 5(B).

The time charts illustrated in FIGS. 4(A), 4(B) and 5(A), 5(B) are concerned with Vx<0. In case Vx>0, the integration slops should be reversed.

While only certain embodiments of the present invention have been described, it will be apparent to those skilled in the art that various changes and modifications may be made therein without departing from the spirit and scope of the invention as claimed.

What is claimed is:

1. A semiconductor electronic circuit for determining an unknown voltage value while compensating for an offset error voltage present in said circuitry comprising:
   a first switched input means for selectively receiving a first reference voltage;
   a second switched input means for selectively receiving a second reference voltage equal to said first reference voltage but reversed in polarity;
   a third switched input means for selectively receiving an unknown voltage value;
   an integrator including a differential amplifier and a feedback capacitor, said integrator being connected to said first, second, and third switched input means and having an output;
   said first switched input means selectively receiving and providing said first reference voltage to said integrator during a first predetermined time period to produce a first integrated voltage value at the output of said integrator, said first predetermined time period beginning when said integrator produces an output greater than zero;
   said second switched input means selectively receiving and providing said second reference voltage to said integrator after said first predetermined timed period is completed and until the output of said integrator equals zero;
   means for measuring the duration of the integration of the input applied by said second switched input means after said first predetermined time period to form a first measured time period;
   said third switched input means selectively receiving and providing said unknown voltage to said integrator during a second predetermined time period to produce a second integrated voltage value at the output of said integrator, said second predetermined time period beginning when said integrator produces an output greater than zero;
   said second switched input means selectively receiving and applying said second reference voltage to said integrator after said second predetermined time period is completed and until output of said integrator is zero;
   means for measuring the duration of the integration of the input applied by said second switched input means after said second predetermined time period to form a second measured time period; and means for determining the value of said unknown voltage using said first and second predetermined time periods, said first and second measured time periods and said first reference voltage.

2. The circuit of claim 1, wherein said means for determining includes a digital computer.

3. The circuit of claim 1, wherein said circuit for determining functions as an analog to digital converter.

4. The circuit of claim 2, wherein the value of said unknown voltage is solved by said means for determining using the equation:

$$V_x = \frac{2t_4 t_1 - t_3(t_2 - t_1)}{t_3(t_1 + t_2)} V_r$$

$V_r$ is said first reference voltage;
$t_1$ is said first predetermined time period;
$t_2$ is said first measured time period;
$t_3$ is said second predetermined time period;
$t_4$ is said second measured time period.

* * * * *